(12) United States Patent  (10) Patent No.: US 9,392,685 B2
Nakajima et al.  (45) Date of Patent: Jul. 12, 2016

(54) TRANSPARENT CONDUCTIVE FILM AND TOUCH PANEL

(75) Inventors: Kazuhiro Nakajima, Ibaraki (JP); Tomotake Nashiki, Ibaraki (JP); Hideo Sugawara, Ibaraki (JP)

(73) Assignee: NITTO DENKO CORPORATION, Ibaraki-shi (JP)

( * ) Notice: Subject to any disclaimer, the term of this patent is extended or adjusted under 35 U.S.C. 154(b) by 216 days.

(21) Appl. No.: 13/991,237

(22) PCT Filed: Dec. 1, 2011

(86) PCT No.: PCT/JP2011/077811
§ 371 (c)(1),
(2), (4) Date: Jun. 3, 2013

(87) PCT Pub. No.: WO2012/074059
PCT Pub. Date: Jun. 7, 2012

(65) Prior Publication Data
US 2013/0241689 A1  Sep. 19, 2013

(30) Foreign Application Priority Data
Dec. 2, 2010 (JP) ................................ 2010-269348

(51) Int. Cl.
*B32B 3/00* (2006.01)
*H05K 1/02* (2006.01)
(Continued)

(52) U.S. Cl.
CPC .............. *H05K 1/0271* (2013.01); *C08J 7/045* (2013.01); *G06F 3/044* (2013.01); *G06F 3/045* (2013.01); *H03K 17/962* (2013.01);
(Continued)

(58) Field of Classification Search
None
See application file for complete search history.

(56) References Cited

U.S. PATENT DOCUMENTS 6,603,085 B2 * 8/2003 Oya et al. ............... 200/512
2001/0037935 A1  11/2001 Oya et al.
(Continued)

FOREIGN PATENT DOCUMENTS

CN  1320929 A  11/2001
CN  101226450 A  7/2008
(Continued)

OTHER PUBLICATIONS

Office Action dated May 14, 2015, issued in counterpart Chinese patent application No. 201180058076.4, with English translation (34 pages).
(Continued)

*Primary Examiner* — Humera Sheikh
*Assistant Examiner* — Seth Dumbris
(74) *Attorney, Agent, or Firm* — Westerman, Hattori, Daniels & Adrian, LLP

(57) ABSTRACT

The present invention provides a transparent conductive film in which occurrence of scratches during sliding is suppressed even when transparent conductive layer forming surfaces are so arranged as to face each other. Provided is a transparent conductive film comprising a transparent film base; at least one dielectric layer formed on a first main surface of the transparent film base; and a transparent conductive layer formed on the dielectric layer, wherein the transparent conductive layer is patterned; and the surface on the first main surface of the transparent conductive film has an arithmetical mean roughness Ra of 22 nm or more, and has 140/mm² or more of protrusions having heights of 250 nm or higher at a pattern-opening part in which the transparent conductive layer is not formed.

13 Claims, 2 Drawing Sheets

(51) Int. Cl.
*G06F 3/044* (2006.01)
*G06F 3/045* (2006.01)
*H03K 17/96* (2006.01)
*C08J 7/04* (2006.01)

(52) U.S. Cl.
CPC ........ *H03K 17/9645* (2013.01); *C08J 2367/02* (2013.01); *C08J 2461/28* (2013.01); *C08J 2491/00* (2013.01)

(56) References Cited

U.S. PATENT DOCUMENTS

| | | | |
|---|---|---|---|
| 2006/0062975 A1 | 3/2006 | Majumdar et al. | |
| 2006/0274048 A1* | 12/2006 | Spath et al. | 345/173 |
| 2007/0091073 A1 | 4/2007 | Nakata et al. | |
| 2007/0252825 A1* | 11/2007 | Nashiki et al. | 345/173 |
| 2008/0138589 A1 | 6/2008 | Wakabayashi et al. | |
| 2008/0176042 A1 | 7/2008 | Nashiki et al. | |
| 2009/0104440 A1 | 4/2009 | Nashiki et al. | |
| 2009/0201268 A1 | 8/2009 | Endo et al. | |
| 2009/0244703 A1* | 10/2009 | Asakura et al. | 359/485 |
| 2009/0284475 A1* | 11/2009 | Nashiki et al. | 345/173 |
| 2010/0196662 A1 | 8/2010 | Mashimo et al. | |
| 2010/0265205 A1 | 10/2010 | Park et al. | |
| 2012/0229423 A1 | 9/2012 | Takamiya et al. | |
| 2012/0273344 A1 | 11/2012 | Nashiki et al. | |

FOREIGN PATENT DOCUMENTS

| | | |
|---|---|---|
| CN | 101794641 A | 8/2010 |
| JP | 2003-94552 A | 4/2003 |
| JP | 2003-266571 A | 9/2003 |
| JP | 2009-104842 A1 | 5/2009 |
| JP | 2009-211680 A | 9/2009 |
| JP | 2010-55453 A | 3/2010 |
| JP | 2010-221715 A | 10/2010 |
| JP | 2010-250801 A | 11/2010 |
| JP | 2011-133881 A | 7/2011 |
| TW | 200623269 | 9/1994 |
| WO | 2006/126604 A1 | 11/2006 |

OTHER PUBLICATIONS

Taiwanese Office Action dated Sep. 19, 2014, issued in corresponding Taiwanese Application No. 100144455; w/ English Translation. (8 pages).

Translation of the International Preliminary Report on Patentability (PCT/IB/338) (1 page), (PCT/IB/373) (1 page) of International Application No. PCT/JP2011/077811 mailed Jun. 13, 2013 (Form PCT/ISA/237) (4 pages).

International Sreach Report PCT/JP2011/077811, Mailing Date of Mar. 6, 2012.

Office action dated Jul. 7, 2015, issued in counterpart Japanese Application No. 2011-263547, with English translation. (9 pages).

* cited by examiner

TRANSPARENT CONDUCTIVE FILM AND TOUCH PANEL

TECHNICAL FIELD

The present invention relates to a transparent conductive film in which a patterned transparent conductive layer is provided on a film base with a dielectric layer interposed therebetween. The present invention also relates to a touch panel including the transparent conductive film.

BACKGROUND ART

Touch panels are classified into an optical type, an ultrasonic type, a capacitive type, a resistive type and the like according to the position detection method. For a resistive touch panel, such a structure is generally employed that a transparent conductive film of an upper electrode and glass with a transparent conductive layer or transparent conductive film of a lower electrode are so arranged as to face each other with a spacer interposed therebetween, and a current is passed through the upper electrode and an electric potential in the lower electrode is measured. A capacitive touch panel has as a basic structure a structure having a patterned transparent conductive layer on a base, and is used for vehicle-mount applications and the like because it has high durability and high transmittance.

The capacitive touch panel allows simultaneous multipoint input (multi-touch) and is excellent in operability, and is therefore rapidly growing in demand. On the other hand, when multi-touch occurs at two or more locations in the resistive touch panel which uses one flat plate electrode, an average electric potential thereof is detected, and a halfway point between the touched two locations is recognized as a touch point. Therefore, the conventional resistive touch panel has been considered to be unsuitable for multi-touch.

On the other hand, it has been recently proposed that multipoint input can be performed by a matrix-type resistive touch panel in which transparent conductive layers patterned in a strip form are used for both an upper electrode and a lower electrode, and arranged in a matrix form so that the pattern directions of these layers are orthogonal to each other (for example Patent Document 1). Such a matrix-type resistive touch panel receives attention because it can be produced at low costs as the required number of transparent conductive films and ICs is small in comparison with the capacitive touch panel.

In both the capacitive touch panel and the matrix-type resistive touch panel, the transparent conductive film which forms an electrode has a pattern part in which a transparent conductive layer is formed on a base and a pattern-opening part in which the transparent conductive layer is not formed on the base. Concerning the transparent conductive film in which the transparent conductive layer is patterned in this way, for example, it is proposed in Patent Document 2 that for suppressing a difference in visibility between the pattern part and the pattern-opening part of the transparent conductive film, a coating layer is provided on a surface of a substrate on which the transparent conductive layer is formed.

PRIOR ART DOCUMENTS

Patent Documents

Patent Document 1: JP-A-2010-250801
Patent Document 2: International Publication No. WO 2006/126604

DISCLOSURE OF THE INVENTION

Problems to be Solved by the Invention

Generally, in a transparent conductive film used in a capacitive touch panel, transparent conductive layers do not contact each other, but in a resistive touch panel, transparent conductive layer forming surfaces are so arranged as to face each other, and pressing input by a pen or the like is performed. Therefore, in a transparent conductive film used in the resistive touch panel, contact and sliding between transparent conductive layer forming parts (pattern parts), between transparent conductive layer non-forming parts (pattern-opening parts) and between the transparent conductive layer forming part and the transparent conductive layer non-forming part may occur between upper and lower electrodes at the time of input.

According to studies by the present inventors, it has been found that in a resistive touch panel in which the transparent conductive layer is patterned, the transparent conductive film is easily scratched in comparison with the conventional resistive touch panel. As a result of further conducting studies, it has been found that these scratches easily occur at the pattern-opening part in which the transparent conductive layer is not formed, and scratches easily occur particularly in a transparent conductive film having a structure in which an organic dielectric layer is exposed at the pattern opening part. In view of such a standpoint, it is an object of the present invention to provide a transparent conductive film in which occurrence of scratches during sliding is suppressed even when transparent conductive layer forming surfaces are so arranged as to face each other.

Means for Solving the Problems

The present inventors have conducted vigorous studies for solving the aforementioned problem, and resultantly found that occurrence of scratches during sliding is suppressed when a pattern-opening part of a transparent conductive film has a specified surface shape, thus leading to the present invention.

The present invention relates to a transparent conductive film comprising a transparent film base, and a transparent conductive layer formed on a first main surface of the transparent film base with at least one dielectric layer interposed therebetween. It is preferred that the transparent conductive layer is patterned and a surface on the first main surface of the transparent conductive film (exposed surface of dielectric layer) has an arithmetical mean roughness Ra of 22 nm or more and has 140/mm$^2$ or more of protrusions having heights of 250 nm or higher at a pattern-opening part in which the transparent conductive layer is not formed.

It is preferred that a surface on the first main surface of the transparent conductive film (surface of transparent conductive layer) has an arithmetical mean roughness Ra of 22 nm or more and has 140/mm$^2$ or more of protrusions having heights of 250 nm or higher at a pattern part in which the transparent conductive layer is formed. It is preferred that a haze value of the transparent conductive film at the pattern-opening part is 2.0% or less. It is preferred that a haze value of the transparent conductive film at the pattern part is 2.0% or less. It is preferred that a thickness of the transparent conductive layer is 50 nm or less.

In one embodiment, the transparent film base contains particles. In one embodiment, at least one dielectric layer contains particles. In one embodiment, the dielectric layer exposed at the pattern-opening part of the transparent conductive film is a dielectric layer composed of an organic material.

In one embodiment, in the transparent conductive film, the transparent conductive layer is patterned in a stripe form. The transparent conductive film of the present invention is particularly suitably used for a resistive touch panel.

Further, the present invention relates to a touch panel comprising the transparent conductive film. In a touch panel according to one embodiment of the present invention, an upper electrode substrate and a lower electrode substrate are arranged with a spacer interposed therebetween. One of the upper electrode substrate and the lower electrode substrate includes the transparent conductive film. The upper electrode substrate and the lower electrode substrate are arranged so that their transparent conductive layer forming surfaces face each other. The transparent conductive layer of the upper electrode substrate and the transparent conductive layer of the lower electrode substrate are both patterned in a stripe form, and arranged so that their patterning directions are orthogonal to each other.

Effect of the Invention

In a transparent conductive film 100 of the present invention, both a pattern part in which a transparent conductive layer is formed and a pattern-opening part in which the transparent conductive layer is not formed each have a specified surface shape. Thus, scratching by friction during sliding is inhibited in any of an area where pattern parts contact each other, an area where pattern-opening parts contact each other and an area where the pattern part and the pattern-opening part contact each other.

MODE FOR CARRYING OUT THE INVENTION

Figure 1:
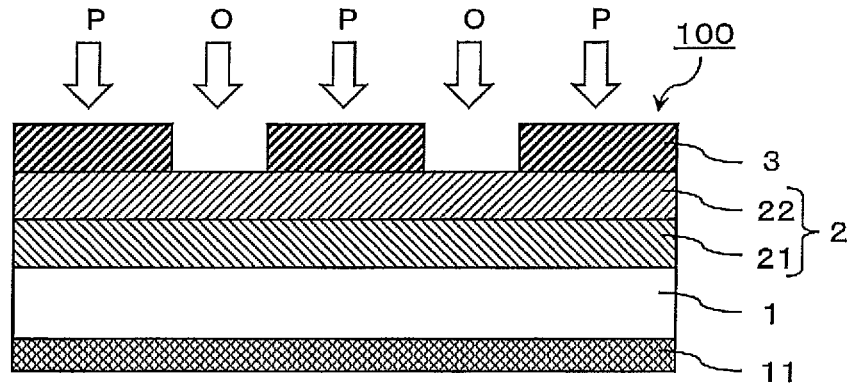
FIG. 1 is a schematic sectional view of a transparent conductive film according to an embodiment of the present invention.

Embodiments of the present invention will be described below with reference to the drawings. FIG. 1 is a sectional view schematically showing one embodiment of a transparent conductive film 100 of the present invention. In FIG. 1, a transparent conductive layer 3 is formed on a first main surface as one main surface of a transparent film base 1 with a dielectric layer 2 interposed therebetween. In FIG. 1, two layers, a first dielectric layer 21 and a second dielectric layer 22, are shown as the dielectric layer 2 from the transparent film base 1 side, but the dielectric layer may be formed of only one layer, or may be formed of three or more layers. The transparent conductive film 100 has a pattern part P in which the transparent conductive layer 3 is formed on the dielectric layer 2 and a pattern-opening part O in which the transparent conductive layer 3 is not formed.

Figure 2:
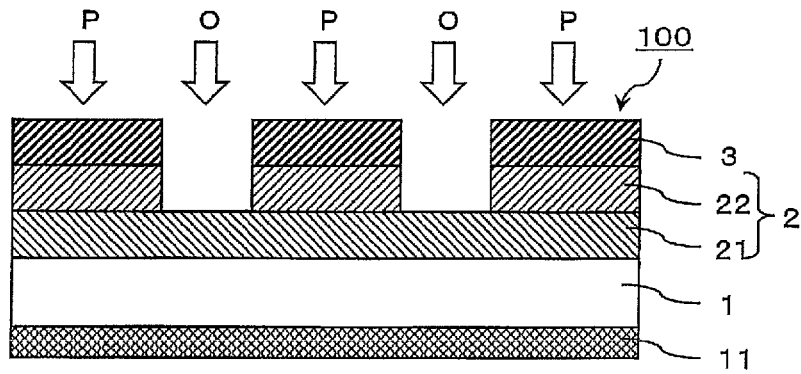
FIG. 2 is a schematic sectional view of a transparent conductive film according to an embodiment of the present invention.

FIG. 2 is a sectional view schematically showing another embodiment of the transparent conductive film 100 of the present invention. In the form of FIG. 2, the dielectric layer 2 is formed of two or more dielectric layers, and the second dielectric layer 22, which is at the largest distance from the transparent film base 1, is patterned as in the case of the transparent conductive layer 3. On the other hand, the first dielectric layer 21 formed on the first main surface of the transparent film base 1 is not patterned. In FIG. 2, the first dielectric layer 21 and the second dielectric layer 22 are shown as the dielectric layer 2, but the dielectric layer 2 may have one or more dielectric layers between the first and second dielectric layers. The dielectric layer formed between two layers, the dielectric layers 21 and 22, may be patterned as in the case of the second dielectric layer 22, or may not be patterned as in the case of the first dielectric layer 21.

Figure 3:
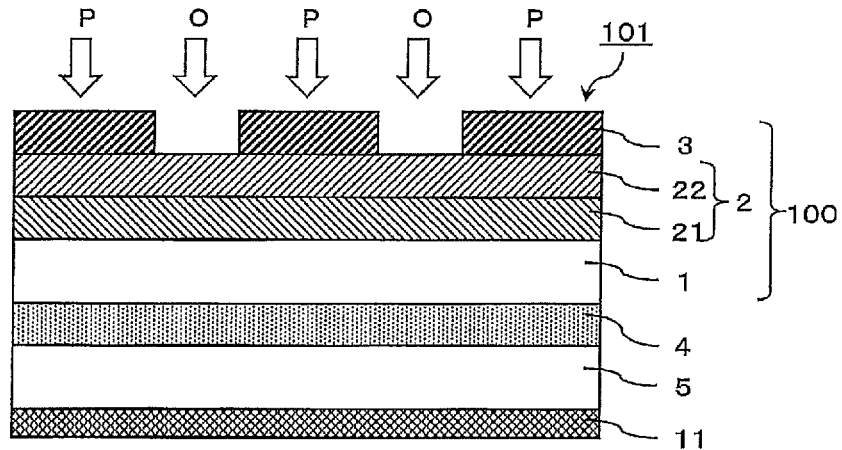
FIG. 3 is a schematic sectional view of a transparent conductive film according to an embodiment of the present invention.

A surface coating layer 11 such as a hard coat layer, an antiglare treatment layer or an antireflection layer may be provided on a second main surface as a main surface of the transparent film base on a side opposite to the side on which the dielectric layer 2 is formed. As shown in FIG. 3, a transparent substrate 5 may be bonded to the second main surface of the transparent film base with an appropriate pressure-sensitive adhesive layer 4 interposed therebetween.

(Transparent Film Base)

The transparent film base 1 is not particularly limited, but various kinds of plastic films having transparency are used. Examples of the material thereof include a polyester-based resin, an acetate-based resin, a polyether sulfone-based resin, a polycarbonate-based resin, a polyamide-based resin, a polyimide-based resin, a polyolefin-based resin, a (meth)acryl-based resin, a polyvinyl chloride-based resin, a polyvinylidene chloride-based resin, a polystyrene-based resin, a polyvinyl alcohol-based resin, a polyarylate-based resin and a polyphenylene sulfide-based resin. Among them, especially preferable are a polyester-based resin, a polycarbonate-based resin and a polyolefin-based resin.

The thickness of the transparent film base 1 is preferably in a range of 2 to 200 μm, more preferably in a range of 2 to 100 μm. If the thickness of the transparent film base 1 is less than 2 μm, the mechanical strength of the transparent film base 1 may be insufficient, thus making it difficult to perform an operation of continuously forming the dielectric layer 2 and the transparent conductive layer 3 with the film base formed into a roll. On the other hand, if the thickness is more than 200 μm, the scratch resistance of the transparent conductive layer 3 and dotting characteristics as intended for use in a touch panel may not be improved.

The first main surface of the transparent film base 1 may be subjected beforehand to an etching treatment or under-coating treatment such as sputtering, corona discharge, flame treatment, ultraviolet ray irradiation, electron beam irradiation, chemical formation or oxidization to improve adhesion with the dielectric layer 2 formed on the film base. The surface of the film base may be freed from dust and cleaned by solvent cleaning or ultrasonic cleaning as necessary before the dielectric layer is formed.

(Dielectric Layer)

It is preferred that at least one dielectric layer is formed on the first main surface of the transparent film base 1. The dielectric layer does not have a function as a conductive layer. That is, the dielectric layer 2 is provided so that pattern parts P and P of the patterned transparent conductive layer 3 are insulated from each other. Therefore, the dielectric layer 2 normally has a surface resistance of $1 \times 10^6 \Omega/\square$ or higher, preferably $1 \times 10^7 \Omega/\square$ or higher, further preferably $1 \times 10^8 \Omega/\square$ or higher. It is to be noted that the upper limit of the surface resistance of the dielectric layer 2 is not particularly specified. The upper limit of the surface resistance of the dielectric layer 2 is generally a measurement limit, which is about $1\times10^{13}\Omega/\square$, but the surface resistance may be higher than $1\times10^{13}\Omega/\square$.

As described in detail later, the patterned transparent conductive layer 3 is formed on the dielectric layer 2. Such a material that a difference between the refractive index of the transparent conductive layer 3 and the refractive index of the dielectric layer is 0.1 or more is suitably used as the dielectric layer 2 from the viewpoint of suppression of a difference in visibility between the pattern part P in which the transparent conductive layer is formed and the pattern-opening part O in which the transparent conductive layer is not formed. It is preferred that the difference between the refractive index of the transparent conductive layer 3 and the refractive index of the dielectric layer is 0.1 or more and 0.9 or less, further preferably 0.1 or more and 0.6 or less. It is preferred that the refractive index of the dielectric layer 2 is normally 1.3 to 2.5, further preferably 1.38 to 2.3, still further preferably 1.4 to 2.3.

The dielectric layer 2 can be formed from an inorganic material, an organic material or a mixture of an inorganic material and an organic material. Examples of the inorganic material include inorganic materials such as NaF (1.3), $Na_3AlF_6$ (1.35), LiF (1.36), $MgF_2$ (1.38), $CaF_2$ (1.4), $BaF_2$ (1.3), $SiO_2$ (1.46), $LaF_3$ (1.55), $CeF_3$ (1.63) and $Al_2O_3$ (1.63) [the numerical value within the parenthesis for the above-mentioned each material is an optical refractive index]. Among them, $SiO_2$, $MgF_2$, $Al_2O_3$ and the like are suitably used. In particular, $SiO_2$ is suitable. Besides the inorganic materials described above, a composite oxide containing about 10 to 40 parts by weight of cerium oxide and about 0 to 20 parts by weight of tin oxide with respect to indium oxide can be used.

Examples of the organic material include an acrylic resin, a urethane resin, a melamine resin, an alkyd resin, a siloxane-based polymer and an organic silane condensate. At least one of these organic materials is used. As the organic material, in particular, it is desirable to use a thermosetting resin formed of a mixture of a melamine resin, an alkyd resin and an organic silane condensate.

It is preferred that the dielectric layer formed on the first main surface of the transparent film base 1 is formed of an organic material in terms of patterning the transparent conductive layer 3 by etching. Therefore, it is preferred that the dielectric layer 2 is formed from an organic material when the dielectric layer 2 is composed of one layer.

It is preferred that at least the second dielectric layer 22, which is at the largest distance from the transparent film base 1, is formed of an inorganic material when the dielectric layer 2 is composed of two or more layers. It is preferred that dielectric layer(s) above the second layer from the transparent film base 1 are also formed of an inorganic material when the dielectric layer 2 has three or more layers. When the second dielectric layer is formed of an inorganic material, only the second dielectric layer can be patterned by etching without etching the first dielectric layer formed on the transparent film base, and therefore a transparent conductive film as shown in FIG. 2 can be easily prepared.

The dielectric layer formed from an inorganic material can be formed by a dry process such as a vacuum deposition method, a sputtering method or an ion plating method, or a wet process by a coating method such as fountain, die coater, casting, spin coating, fountain metaling or gravure. The inorganic material that forms the dielectric layer is preferably $SiO_2$ as described previously. In the wet process, a $SiO_2$ film can be formed by applying silica sol or the like. It is preferred that the dielectric layer formed from an inorganic material is formed by the wet process. It is preferred that a film is formed by the wet process particularly when fine particles are included in the dielectric layer for the purpose of controlling the surface shape of the dielectric layer, or the like.

The thickness of the dielectric layer 2 is not particularly limited, but is normally about 1 to 300 nm from the viewpoint of optical design, blocking of oligomers generated from the film base 1, and suppression of the difference in visibility between the pattern part P and the pattern-opening part O. Generally, the transparent film base contains particles in the film for improvement of transportability and handling characteristics, and the thickness of the dielectric layer 2 is preferably 50 nm or less, more preferably 4 nm to 45 nm, further preferably 5 nm to 40 nm from the viewpoint of keeping a surface shape specific to this base to obtain a transparent conductive film having a specified surface shape. When the dielectric layer 2 is composed of two or more dielectric layers, the total of the thicknesses of the layers is preferably in the range described above.

(Surface Shape of Dielectric Layer)

The surface of the dielectric layer 2 preferably has an arithmetical mean roughness Ra of 22 nm or more, and preferably has $140/mm^2$ or more of protrusions having heights of 250 nm or higher. The arithmetical mean roughness Ra of the surface is more preferably 24 nm to 50 nm, further preferably 24 nm to 40 nm, especially preferably 24 to 35 nm. The number of protrusions having heights of 250 nm or higher, on the surface of the dielectric layer, is more preferably $140/mm^2$ to $550/mm^2$, further preferably $200/mm^2$ to $500/mm^2$. The upper limit of the height of the protrusion is preferably 1500 nm or less from the viewpoint of preventing a situation in which light scattering increases, so that the haze becomes higher.

In the embodiment in which the dielectric layer 2 is not patterned as shown in FIG. 1, the surface of the dielectric layer 2 is an exposed surface of the transparent conductive film at the pattern-opening part O. When the transparent conductive layer 3 is formed on the dielectric layer 2 by a dry process such as a sputtering method, the transparent conductive layer 3 has a surface shape which almost follows the surface shape of the dielectric layer 2. Therefore, when the surface of the dielectric layer 2 has a surface shape as described above, a transparent conductive film can be obtained in which the pattern part P and the pattern-opening part O also have similar surface shapes.

Further, in the configuration in which the second dielectric layer 22 of the dielectric layer 2, which is at the largest distance from the transparent film base 1, is patterned as shown in FIG. 2, it is preferred that the surface of the dielectric layer 2 (the surface of the second dielectric layer 22) has a surface shape as described above, and also the surface of the dielectric layer 21, which is an exposed surface at the pattern-opening part O, has a similar surface shape.

The method for forming a dielectric layer having a surface shape as described above is not particularly limited, and an appropriate method may be employed. Examples thereof include a method in which the surface of the dielectric layer is subjected to a roughening treatment by an appropriate method such as a sand blast or emboss roll, or chemical etching to provide the surface with a fine unevenness, and a method in which the transparent film base 1, the surface of which is subjected to a roughening treatment as described above, is used, and a dielectric layer is formed on the surface subjected to the roughening treatment. A dielectric layer having an expected surface shape can also be formed by a method in which a dielectric layer is formed on a transparent film base containing fine particles and having a specified surface shape, or with the dielectric layer 2 containing fine particles. Above all, it is preferred that the transparent film base and/or the dielectric layer contain fine particles from the viewpoint of being capable of easily forming a desired surface shape.

For the fine particles that are contained in the transparent film base and/or the dielectric layer, those having transparency, such as various kinds of metal oxides, glass and plastic, can be used particularly without limitation. Examples thereof include inorganic fine particles such as silica, alumina, titanium, zirconia and calcium oxide, crosslinked or uncrosslinked organic fine particles formed of various kinds of polymers such as polymethyl methacrylate, polystyrene, polyurethane, acryl-based resins, acryl-styrene copolymers, benzoguanamine, melamine and polycarbonate, and silicone-based fine particles. One or more of the aforementioned fine particles can be appropriately selected and used.

When the transparent film base contains fine particles, silicone-based fine particles are suitably used as the fine particles from the viewpoint of imparting transportability and slidability while maintaining the transparency of the base. The average particle diameter of the fine particles contained in the transparent film base is preferably about 0.005 μm to 5 μm, more preferably about 0.01 to 3 μm. Fine particles having different particle diameters can be used in combination.

When the dielectric layer contains fine particles, silicone-based fine particles are suitably used as the fine particles from the viewpoint of imparting transportability and slidability while maintaining the transparency. Zirconium oxide particles and the like are suitably used from the viewpoint of improving the visibility of the transparent conductive film by controlling the refractive index of the dielectric layer. The average particle diameter of the fine particles contained in the dielectric layer is preferably about 0.005 μm to 5 μm, more preferably about 0.01 to 3 μm.

When the dielectric layer 2 is composed of two or more layers, at least one dielectric layer which contains fine particles, and dielectric layers which do not contain fine particles may be formed. For example, the first dielectric layer 21 containing fine particles may be formed on the transparent film base 1 by a wet process, and the second dielectric layer of an inorganic material which does not contain fine particles may be formed thereon by a dry process.

(Transparent Conductive Layer)

The constituent material of the transparent conductive layer 3 is not particularly limited, and a metal oxide of at least one metal selected from the group consisting of indium, tin, zinc, gallium, antimony, titanium, silicon, zirconium, magnesium, aluminum, gold, silver, copper, palladium and tungsten is used. The metal oxide may further contain metal atoms shown in the above-mentioned group as necessary. For example, indium oxide containing tin oxide (ITO), tin oxide containing antimony (ATO), and the like are preferably used.

The thickness of the transparent conductive layer 3 is not particularly limited, but is preferably 10 nm or more for forming a continuous film having such good conductivity that its surface resistance is $1 \times 10^3 \Omega/\square$ or less. If the thickness is too large, the transparency is deteriorated, and therefore the thickness is preferably 15 to 35 nm, more preferably within a range of 20 to 30 nm. If the thickness of the transparent conductive layer is too small, the surface resistance increases and a continuous film is hard to be formed. If the thickness of the transparent conductive layer is too large, the transparency may be deteriorated. If the thickness of the transparent conductive layer is large, its surface tends to have such a shape that the unevenness of the surface of the dielectric layer as a ground layer is moderated. Accordingly, the arithmetical mean roughness Ra and the number of protrusions of the surface of the transparent conductive layer fall below an expected range, so that scratches may easily occur when a touch panel is formed.

The method for forming the transparent conductive layer 3 is not particularly limited, and a conventionally known method can be employed. Specific examples thereof include a vacuum deposition method, a sputtering method and an ion plating method. An appropriate method can also be employed according to a required thickness. The transparent conductive layer 3 can be crystallized by carrying out an annealing treatment at temperatures within a range of 100 to 150° C. as necessary after the transparent conductive layer 3 is formed. Therefore, it is preferred that the film base 1 has a heat resistance of 100° C. or higher, further preferably 150° C. or higher. In the present invention, the transparent conductive layer 3 is etched to be patterned. When the transparent conductive layer 3 is crystallized, etching may be difficult, and therefore it is preferred that the annealing treatment of the transparent conductive layer 3 is carried out after the transparent conductive layer 3 is patterned. Further, when the dielectric layer 2 is etched, it is preferred that the annealing treatment of the transparent conductive layer 3 is carried out after etching of the dielectric layer 2.

Figure 4:
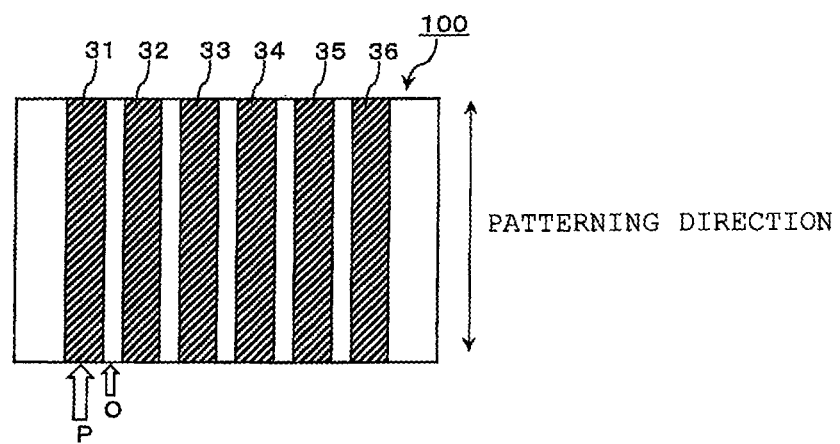
FIG. 4 is a schematic plan view of a transparent conductive film according to an embodiment of the present invention.

As shown in FIGS. 1, 2 and so on, the transparent conductive layer 3 is patterned into the pattern part P in which the transparent conductive layer is formed on the dielectric layer 2 and the pattern-opening part O in which the transparent conductive layer is not formed. Examples of the pattern shape include a form in which each pattern part P is formed in a strip form, and the pattern part P and the pattern-opening part O are arranged in a stripe form. In particular, when the transparent conductive film is used in a matrix-type resistive touch panel, it is preferred that the transparent conductive layer is patterned in a stripe form. FIG. 4 is a schematic plan view of the transparent conductive film 100 of the present invention, which shows one example of the form in which transparent conductive layers 31 to 36 are formed in a strip form and patterned into a stripe form at each pattern part P. In FIG. 4, the width of the pattern part P is larger than the width of the pattern-opening part O, but the present invention is not limited to such a form.

(Patterning Method)

The method for production of the transparent conductive film of the present invention is not particularly limited as long as the dielectric layer 2 and transparent conductive layer 3 as described above are formed on the transparent film base 1. The transparent conductive film can be produced by, for example, preparing a transparent conductive film having a transparent conductive layer, on a transparent film base, with at least one dielectric layer interposed therebetween according to a usual method, followed by etching the transparent conductive layer to be patterned. In etching, the transparent conductive layer is covered with a mask for forming a pattern, and the transparent conductive layer is etched with an etchant.

Since as a material of the transparent conductive layer 3, indium oxide containing tin oxide or tin oxide containing antimony is suitably used as described previously, an acid is suitably used as an etchant. Examples of the acid include inorganic acids such as hydrogen chloride, hydrogen bromide, sulfuric acid, nitric acid and phosphoric acid, organic acids such as acetic acid, mixtures thereof, and aqueous solutions thereof.

When the dielectric conductive layer 2 is composed of at least two layers, only the transparent conductive layer 3 can be etched to be patterned as shown in FIG. 1 and in addition, at least the second dielectric layer 22, which is at the largest distance from the transparent film base, can be etched to be patterned as in the case of the transparent conductive layer 3 after the transparent conductive layer 3 is etched with an acid to be patterned as shown in FIG. 2. When the dielectric layer is composed of three or more layers, it is preferred that transparent conductive layers other than the first dielectric layer on the transparent film base are etched to be patterned as in the case of the transparent conductive layer 3.

In etching of the dielectric layer, the surface of the dielectric layer 2 is covered with a mask for forming a pattern similar to that formed by etching the transparent conductive layer 3, and the dielectric layer is etched with an etchant. Since for the second dielectric layer 22, an inorganic material such as $SiO_2$ is suitably used as described previously, an alkali is suitably used as an etchant. Examples of the alkali include aqueous solutions of sodium hydroxide, potassium hydroxide, ammonia, tetramethyl ammonium hydroxide and the like, and mixtures thereof. In such an embodiment, it is preferred that the first dielectric layer on the transparent film base 1 is formed from an organic material which is not etched with an acid or an alkali as described previously.

(Surface Shape of Transparent Conductive Film)

The surface of the transparent conductive film 100 on the first main surface at the pattern-opening part O, i.e., the exposed surface of the dielectric layer 2 preferably has an arithmetical mean roughness Ra of 22 nm or more, and preferably has $140/mm^2$ or more of protrusions having heights of 250 nm or higher. The arithmetical mean roughness Ra is more preferably 24 nm to 50 nm, further preferably 24 nm to 40 nm, especially preferably 24 to 35 nm. The number of protrusions having heights of 250 nm or higher, on the surface of the dielectric layer, is more preferably $140/mm^2$ to $550/mm^2$, further preferably $200/mm^2$ to $500/mm^2$. When the pattern-opening part of the transparent conductive film has a surface shape as described above, occurrence of scratches at the surface of the dielectric layer at the pattern-opening part is inhibited even if a touch panel is formed in such a manner that a substrate with a different transparent conductive layer (e.g., a different transparent conductive film or glass with transparent conductive layer) and the transparent conductive layer are so arranged as to face each other. The upper limit of the height of the protrusion is preferably 1500 nm or less from the viewpoint of preventing a situation in which light scattering increases, so that the haze becomes higher.

According to studies by the present inventors, it has been found that in a resistive touch panel in which the transparent conductive layer is patterned, scratches easily occur particularly at the pattern-opening part of the contact area between the transparent conductive layer of the pattern part and the dielectric layer of the pattern-opening part and the contact area between dielectric layers of the pattern-opening part, i.e., the exposed surface of the dielectric layer. In particular, when the dielectric layer of an organic material is exposed at the pattern-opening part O, scratches tend to easily occur at the organic material dielectric layer of the pattern-opening part if, for example, the dielectric layer 2 is composed of one dielectric layer of an organic material, or if the dielectric layer 2 is composed of two or more dielectric layers as shown in FIG. 2 and the first dielectric layer 21, which is not patterned, is a dielectric layer of an organic material.

The reason why scratches easily occur at the pattern-opening part of the transparent conductive film as described above is considered to be because the hardness of the dielectric layer is generally smaller than that of the transparent conductive layer. In contrast, it has been found that when the transparent conductive film has a surface shape as described above, the coefficient of dynamic friction between the pattern part and the pattern-opening part and the coefficient of dynamic friction between pattern-opening parts decrease, so that scratches resulting from rubbing between films rarely occur even if the transparent conductive film is caused to slide. Thus, it is considered that in the present invention, both the pattern-opening parts have surface shapes as described above, and therefore the coefficient of dynamic friction is reduced, so that occurrence of scratches during sliding is inhibited.

If the arithmetical mean roughness Ra of the surface is too small, or the number of protrusions having heights higher than 250 nm is too small, scratches tend to easily occur at the surface of the transparent conductive film, particularly at the pattern-opening part in which the transparent conductive layer is not formed, at the time of contact or sliding between the upper electrode and the lower electrode. On the other hand, if the arithmetical mean roughness Ra of the surface is too large, or the number of protrusions having heights higher than 250 nm is too large, there is a tendency that the visibility is deteriorated because scattering of light increases at the electrode surface, or particles fall off the film surface.

Generally the number of protrusions tends to increase as Ra increases, but if the average particle diameter of fine particles contained in, for example, the base film or the dielectric layer is set to about 0.3 to 3 µm, a surface shape having a specified arithmetical mean roughness Ra and number of protrusions as described above can be achieved. In addition, Ra and the number of protrusions can be independently controlled to fall within a desired range by using the base or the dielectric layer to which particles having a wide particle size distribution range or particles having different particle diameters (particle size distributions) or characteristics are mixed. The arithmetical mean roughness Ra of the surface and the number of protrusions having height higher than 250 nm are measured by the methods described in Examples described later.

Further, the surface of the transparent conductive film 100 on the first main surface at the pattern part P, i.e., the surface of the transparent conductive layer 3 preferably has an arithmetical mean roughness Ra of 22 nm or more, and preferably has $140/mm^2$ or more of protrusions having heights of 250 nm or higher. The arithmetical mean roughness Ra is more preferably 24 nm to 50 nm, further preferably 24 nm to 40 nm, especially preferably 24 to 35 nm. The number of protrusions having heights of 250 nm or higher, on the surface of the dielectric layer, is more preferably $140/mm^2$ to $550/mm^2$, further preferably $200/mm^2$ to $500/mm^2$. The upper limit of the height of the protrusion is preferably 1500 nm or less from the viewpoint of preventing a situation in which light scattering increases, so that the haze becomes higher.

When a touch panel is formed, the pattern-opening part O of the transparent conductive film has such a tendency that scratches easily occur at the contact surface with the pattern part in which the transparent conductive layer of the opposed substrate is formed. When the pattern part P has a surface shape as described above, occurrence of scratches at the pattern-opening part O of the opposed substrate is inhibited. This is considered to be because the pattern part P of one electrode has a surface shape as described above, and thus the coefficient of dynamic friction with the pattern-opening part O of the opposed other electrode decreases, so that occurrence of scratches at the pattern-opening part O resulting from rubbing between films is suppressed even if the transparent conductive film is caused to slide.

The haze value at the pattern-opening part O of the transparent conductive film 100 is preferably 2.0% or less, more preferably 0.1% to 1.5%. The aforementioned haze value is a haze value (haze) of the whole of the transparent conductive film at the pattern-opening part in accordance with JIS K 7136 (2000 edition). If the haze value exceeds the range described above, occurrence of light scattering may become significant, leading to deterioration of the visibility of the transparent conductive film.

The haze value at the pattern part P of the transparent conductive film 100 is preferably 2.0% or less, more preferably 0.1% to 1.5%. The aforementioned haze value is a haze value (haze) of the whole of the transparent conductive film at the pattern part in accordance with JIS K 7136 (2000 edition). If the haze value exceeds the range described above, occurrence of light scattering may become significant, leading to deterioration of the visibility of the transparent conductive film.

(Surface Coating Layer)

As the surface coating layer 11 of the transparent conductive film 100, a hard coat layer intended for improvement of the surface hardness, or an antiglare treatment layer or antireflection layer intended for improvement of the visibility can be provided. In particular, when the transparent conductive film is used for an upper electrode of a resistive touch panel, it is preferred that the above-mentioned surface coating layer is formed on the second main surface of the transparent film base 1.

As the hard coat layer, for example, a cured film formed of a curable resin such as a melamine-based resin, a urethane-based resin, an alkyd-based resin, an acryl-based resin or a silicone-based resin is suitably used. The thickness of the hard coat layer is preferably 0.1 to 30 μm. If the thickness is less than 0.1 μm, the hardness may be insufficient. If the thickness is more than 30 μm, the hard coat layer may be cracked, or curl may occur in the whole of the transparent conductive film.

The constituent material of the antiglare treatment layer is not particularly limited, and for example an ionizing radiation-curable resin, a thermosetting resin, a thermoplastic resin or the like can be used. The thickness of the antiglare treatment layer is preferably 0.1 to 30 μm.

For the antireflection layer, titanium oxide, zirconium oxide, silicon oxide, magnesium fluoride or the like is used. For making the antireflection function exhibit more significantly, a laminated body of a titanium oxide layer and a silicon oxide layer is preferably used. This laminated body is preferably a two-layer laminated body in which a titanium oxide layer having a high refractive index (refractive index: about 1.8) is formed on a hard coat layer and a silicon oxide layer having a low refractive index (refractive index: about 1.45) is formed on the titanium oxide layer, or a four-layer laminated body in which a titanium oxide layer and a silicon oxide layer are further formed in this order on the two-layer laminated body. By providing an antireflection layer composed of such a two-layer laminated body or four-layer laminated body, reflection of light in a visible light wavelength range (380 to 780 nm) can be evenly reduced.

<Description of Embodiment in FIG. 3>

The transparent conductive film of the present invention can also have a configuration in which the transparent substrate 5 is bonded to the second main surface of the transparent film base 1 with the transparent pressure-sensitive adhesive layer 4 interposed therebetween as shown in FIG. 3. The transparent substrate 5 may be composed of one substrate film, or may be a laminated body of two or more substrate films (for example, substrate films are laminated with a transparent pressure-sensitive adhesive layer interposed therebetween). As shown in FIG. 3, the surface coating layer 11 such as a hard coat layer (resin layer), an antiglare treatment layer or an antireflection layer may be provided on the outer surface of the transparent substrate 5. FIG. 3 shows as an example of the configuration in which the transparent substrate 5 is bonded to the transparent conductive film 100 of FIG. 1, but a transparent conductive film having the configuration of FIG. 2, in place of the configuration of FIG. 1, can be applied.

(Transparent Substrate)

The thickness of the transparent substrate 5 is, normally, preferably 90 to 300 μm, more preferably 100 to 250 μm. When the transparent substrate 5 is formed from a plurality of substrate films, the thickness of each substrate film is preferably 10 to 200 μm, further preferably 20 to 150 μm, and it is preferred that the total thickness as the transparent substrate 5 with a transparent pressure-sensitive adhesive layer included in these substrate films is controlled to fall within the aforementioned range. For the substrate film, a material similar to that of the aforementioned transparent film base 1 is suitably used.

Bonding of the transparent conductive film 100 and the transparent substrate 5 may be achieved by providing the pressure-sensitive adhesive layer 4 on the transparent substrate 5 side beforehand, and bonding thereto the transparent film base 1 of the transparent conductive film, or may be achieved by, conversely, providing the pressure-sensitive adhesive layer 4 on the transparent film base 1 side of the transparent conductive film beforehand, and bonding thereto the transparent substrate 5. The latter method is more advantageous in terms of productivity because the pressure-sensitive adhesive layer 4 can be continuously formed with the transparent film base 1 formed into a roll. The transparent conductive film 100 and the transparent substrate 5 can also be laminated by bonding to the transparent film base 1 a plurality of substrate films one after another with a pressure-sensitive adhesive layer interposed therebetween. For the transparent pressure-sensitive adhesive layer used for lamination of the transparent substrate 5, one similar to the transparent pressure-sensitive adhesive layer 4 described below can be used. For bonding the transparent conductive films together, a laminated surface of the transparent conductive film, to which the pressure-sensitive adhesive layer 4 is laminated, can be appropriately selected to bond the transparent conductive films together.

(Pressure-Sensitive Adhesive Layer)

For the pressure-sensitive adhesive layer 4, any material can be used without particular limitation as long as it has transparency. Specifically, for example, one having as a base polymer a polymer such as an acryl-based polymer, a silicone-base polymer, a polyester, a polyurethane, a polyamide, a polyvinyl ether, a vinyl acetate/vinyl chloride copolymer, a modified polyolefin, an epoxy-based polymer, a fluorine-based polymer, or a rubber-based polymer such as natural rubber or synthetic rubber can be appropriately selected and used. In particular, an acryl-based pressure-sensitive adhesive is preferably used in terms of being excellent in optical transparency, showing moderate wettability, and adhesive characteristics such as cohesiveness, tackiness, and also being excellent in weather resistance, heat resistance and the like.

Some kinds of pressure-sensitive adhesives that are constituent materials of the pressure-sensitive adhesive layer 4 are capable of improving the anchoring force with an appropriate under-coating agent for adhesion. Therefore, when such a pressure-sensitive adhesive is used, it is preferred to use an under-coating agent for adhesion.

A crosslinking agent appropriate to the base polymer can be included in the aforementioned pressure-sensitive adhesive layer 4. For example, appropriate additives such as a filler formed of resins of a natural product or synthetic product, glass fibers, glass beads, a metal powder or other inorganic powders, a pigment, a colorant and an antioxidant can also be blended in the pressure-sensitive adhesive layer 4 as necessary. Also, transparent fine particles can be included to form the pressure-sensitive adhesive layer 4 provided with light diffusion characteristics.

The aforementioned pressure-sensitive adhesive layer 4 is normally used as a pressure-sensitive adhesive solution having a solid concentration of about 10 to 50% by weight, which is obtained by dissolving or dispersing a base polymer or a composition thereof in a solvent. As the aforementioned solvent, solvent appropriate to the type of the pressure-sensitive adhesive, such as an organic solvent including toluene or ethyl acetate, or water can be appropriately selected and used.

This pressure-sensitive adhesive layer 4 can have a function of, for example, improving the scratch resistance of the transparent conductive layer 3 provided on one surface of the transparent film base, and dotting characteristics as intended for use in a touch panel, namely pen input durability and contact pressure durability, owing to its cushion effect, after the transparent substrate 5 is attached. Thus, particularly when the transparent conductive film is used for an upper electrode (electrode on the input surface) of a resistive touch panel, a laminated form as shown in FIG. 3 is suitably employed. From the viewpoint of exhibiting the cushion effect more satisfactorily, it is desirable to set the elastic modulus of the pressure-sensitive adhesive layer 4 to a range of 1 to 100 N/cm$^2$ and the thickness to 1 μm or more, normally in a range of 5 to 100 μm. If the thickness of the pressure-sensitive adhesive layer falls within the range described above, the cushion effect can be sufficiently exhibited, and the adhesive strength between the transparent substrate 5 and the transparent film base 1 can be sufficient. If the thickness of the pressure-sensitive adhesive layer 4 falls below the range described above, the above-described durability and adhesion cannot be sufficiently secured, and if the thickness exceeds the range described above, appearance characteristics such as transparency may become unsatisfactory.

The transparent substrate 5 bonded with the pressure-sensitive adhesive layer 4 interposed can impart satisfactory mechanical strength to the transparent film base 1, and contribute to prevention of occurrence of curl and the like in addition to pen input durability and contact pressure durability.

(Touch Panel)

The transparent conductive film of the present invention can be suitably applied to, for example, touch panels of optical type, ultrasonic type, capacitive type, resistive type and the like. In particular, the transparent conductive film is suitably used in resistive touch panels, particularly in resistive touch panels which allow multi-point input, because scratching of the pattern-opening part during sliding is suppressed.

Figure 5:
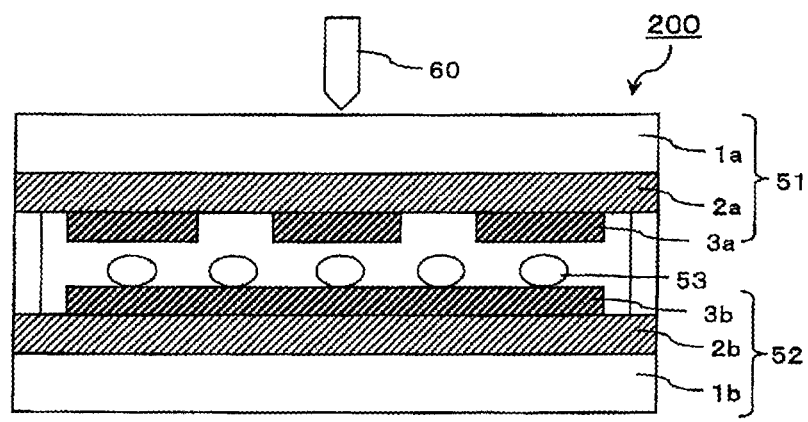
FIG. 5 is a schematic sectional view of a touch panel according to an embodiment of the present invention.

FIG. 5 is a sectional view schematically showing an embodiment of a touch panel 200 of the present invention. The touch panel in FIG. 5 is a resistive touch panel, which includes an upper electrode substrate 51 on the input surface and a lower electrode substrate 52 on the display parts side. An appropriate spacer 53 is arranged between the upper electrode substrate 51 and the lower electrode substrate 52. The respective upper electrode substrate and the lower electrode substrate have a transparent conductive layer formed on the substrate. The transparent conductive layer of each electrode substrate is patterned in a stripe form as shown schematically in the plan view in FIG. 4, and the patterning directions of both the transparent conductive layers are orthogonal to each other.

A base 1a of the upper electrode substrate 51 is formed of a flexible transparent film. As the spacer 53, for example a dot spacer formed of an insulating material such as acryl or urethane can be used. The touch panel 200 functions as a transparent switch body structure such that transparent conductive layers 3a and 3b contact each other to create an ON state as in an electric circuit when the panel is dotted under a pressing force against the elastic force of the spacer 53 from the upper electrode substrate 51 side using an input pen 60, and a return is made to the original OFF state when the pressing force is released. One or both of the upper electrode substrate 51 and the lower electrode substrate 52 of the touch panel 200 include the above-mentioned transparent conductive film of the present invention.

When the upper electrode substrate 51 includes the transparent conductive film of the present invention, the lower electrode substrate 52 may be the transparent conductive film of the present invention, or may be a different transparent conductive film. The base 1b of the lower electrode substrate is not required to be flexible, and for example a glass substrate or the like may be used.

When the lower electrode substrate 52 includes the transparent conductive film of the present invention, the upper electrode substrate 51 may be the transparent conductive film of the present invention, or may be a different transparent conductive film, but it is preferred that at least the base 1a is a flexible base.

In FIG. 5, a configuration is shown in which each of the upper electrode substrate 51 and the lower electrode substrate 52 includes one base 1a, 1b, but as shown in, for example, FIG. 3, a structure may also be used in which a transparent substrate is bonded to the transparent conductive film with a pressure-sensitive adhesive layer interposed therebetween. For the lower electrode substrate, a laminated body obtained by bonding a base such as glass to the transparent conductive film can also be used. When one electrode substrate includes the transparent conductive film of the present invention, the other transparent electrode substrate may have no dielectric layer 2a, 2b. The dielectric layer 2a, 2b may be a layer, a part of which is patterned like the transparent conductive layer as shown in FIG. 2, as well as a layer that is not patterned as shown in FIG. 1.

In the touch panel of the present invention, the coefficient of dynamic friction between the pattern-opening part (transparent conductive layer non-forming part) of the upper electrode substrate 51 and the pattern-opening part of the lower electrode substrate 52 is preferably 0.45 or less. The coefficient of dynamic friction between the pattern-opening part of the upper electrode substrate 51 and the pattern part (transparent conductive layer forming part) of the lower electrode substrate and the coefficient of dynamic friction between the pattern part of the upper electrode substrate and the pattern-opening part of the lower electrode substrate are both preferably 0.45 or less. If the coefficient of dynamic friction between the upper electrode and the lower electrode is made to fall within the aforementioned range, occurrence of scratches at the pattern-opening part, which results from rubbing between films, can be inhibited. The coefficient of dynamic friction of the pattern part is preferably 0.36 or less, further preferably 0.33 or less. The coefficient of dynamic friction between the pattern part and the pattern-opening part is preferably 0.45 or less, further preferably 0.40 or less.

When the transparent conductive film of the present invention is used for only one of the upper electrode substrate and the lower electrode substrate, the coefficient of dynamic friction can be made to fall within the aforementioned range by, for example, adjusting the surface shapes of the pattern part and the pattern-opening part of the other electrode substrate to fall within such a preferred range as described previously concerning the transparent conductive film of the present invention. When the transparent conductive film of the present invention is used for both the upper electrode substrate and lower electrode substrate, both the upper electrode and lower electrode have specified surface shapes, and therefore the coefficient of dynamic friction can be made to fall within the aforementioned range.

The touch panel of the present invention is excellent in visibility and can be suitably used as a touch panel for various kinds of display devices because the transparent conductive film is rarely scratched at the pattern-opening part even by a pressing force with a pen and sliding. In particular, when a transparent conductive film having a configuration in which a part of the dielectric layer 2 is patterned like the transparent conductive layer 3 as shown in FIG. 2 is used, a touch panel can be provided in which a difference in visibility between the pattern part and the pattern-opening part is suppressed, and deterioration of visibility resulting from occurrence of scratches is also suppressed even if the dielectric layer of an organic material is exposed at the pattern-opening part.

EXAMPLES

The present invention will be described in detail below with reference to Examples, but the present invention is not limited to Examples below as long as the gist of the present invention is maintained.

<Preparation of Transparent Conductive Film>

Example 1

(Base)
A polyethylene terephthalate film (hereinafter, referred to as a PET film) having a thickness of 23 µm was used as a base. The PET film contained silicone-based fine particles, the arithmetical mean roughness Ra of the surface of the base was 30.5 nm, and the number of protrusions having heights of 250 nm or higher was 425/mm².

(Formation of Dielectric Layer)
A thermosetting resin composition having a melamine resin, an alkyd resin and an organic silane condensate at a weight ratio of 2:2:1 was applied onto the PET base, and dried and cured to form a first dielectric layer having a thickness of 10 nm. A silica sol (COLCOAT PX manufactured by COLCOAT CO., LTD.) diluted with ethanol so as to have a solid concentration of 2% by weight was applied onto the first dielectric layer, and thereafter dried and cured to form a second dielectric layer having a thickness of 25 nm.

(Formation of ITO Film)
Next, an ITO film having a thickness of 23 nm was formed on the second dielectric layer by a reactive sputtering method using a sintered material of 97% by weight of indium oxide and 3% by weight of tin oxide in an atmosphere of 0.4 Pa including 98% of argon gas and 2% of oxygen gas.

(Patterning of ITO Film and Second Dielectric Layer)
A photoresist patterned in a stripe form was applied to a transparent conductive layer of a transparent conductive film, and dried and cured, and thereafter the film was immersed in 5 wt % hydrochloric acid (aqueous hydrogen chloride solution) at 25° C. for 1 minute to etch the ITO film. The film, on which the photoresist was laminated, was immersed in a 2 wt % aqueous sodium hydroxide solution at 45° C. for 3 minutes to etch the second dielectric layer, and thereafter the photoresist was removed.

(Crystallization of ITO Film)
The transparent conductive film after patterning was heated at 140° C. for 90 minutes to crystallize the ITO film.

The transparent conductive film thus obtained has a laminated form as shown in FIG. 2, wherein a dielectric layer 21 of an organic material, a patterned dielectric layer 21 of an inorganic material and a patterned transparent conductive layer 3 composed of a crystalline ITO film are formed on a PET film base 1. The transparent conductive film obtained in Example 1 is designated as "transparent conductive film A".

Example 2

Only the first dielectric layer was formed in a thickness of 35 nm instead of forming the first dielectric layer and the second dielectric layer in formation of the dielectric layer in Example 1 described above. Otherwise in the same manner as in Example 1, an ITO film was formed, patterned and crystallized (the dielectric layer was not patterned).

In the transparent conductive film thus obtained, a dielectric layer of an organic material and a patterned transparent conductive layer composed of a crystalline ITO film are formed on a PET film base. The transparent conductive film obtained in Example 2 is designated as "transparent conductive film B".

Comparative Example 1

The thicknesses of the first dielectric layer and the second dielectric layer were 180 nm and 33 nm, respectively, in formation of the dielectric layer in Example 1 described above. Otherwise in the same manner as in Example 1, an ITO film was formed, the ITO film and second dielectric layer were patterned, and the ITO film was crystallized. The transparent conductive film obtained in Comparative Example 1 is designated as "transparent conductive film C".

<Evaluation of Surface Shape>
The surface shapes of a pattern part and a pattern-opening part, for the transparent conductive films A, B and C obtained in Examples 1 and 2 and Comparative Example 1, were measured in a range of 600 µm×450 µm using an atomic force microscope (product name "Nanscope IIIa+D3000" manufactured by AFM Digital Instruments). The arithmetical mean roughness Ra was determined from the obtained surface shape, and the number of protrusions per 1 mm² was calculated from the number of protrusions having heights of 250 nm or higher and 1500 nm or lower from the mean line of Ra (line with Ra being 0 nm) in a measurement range (0.27 mm²).

<Measurement of Haze Value>
The haze values at the pattern part and the pattern-opening part, for the transparent conductive films A, B and C obtained in Examples 1 and 2 and Comparative Example 1, were measured. For the measurement method of the haze value, measurements were made in accordance with the "haze" in JIS K 7136 (2000 edition) using a haze meter (product name "HM-150" manufactured by MURAKAMI COLOR RESEARCH LABORATORY CO., Ltd.). However, when the haze value is measured with the pattern part and the pattern-opening part intermingled with each other, one part is affected by the other part, so that the haze value at each part alone is not indicated. Therefore, the haze value was measured using transparent conductive films in which the ITO film remained in its entirety (i.e., transparent conductive films whose ITO film was not patterned) as to the haze value at the pattern part, and using transparent conductive films in which the ITO film was removed in its entirety by etching as to the haze value at the pattern-opening part.

TABLE 1

| | | Pattern part (surface of ITO film) | | | Pattern-opening part (surface of dielectric layer) | | |
|---|---|---|---|---|---|---|---|
| | | Ra (nm) | Number of protrusions having heights of 250 nm or higher (number/mm$^2$) | Haze value (%) | Ra (nm) | Number of protrusions having heights of 250 nm or higher (number/mm$^2$) | Haze value (%) |
| Example 1 | Transparent conductive film A | 30.3 | 374 | 1.0 | 28.5 | 400 | 1.0 |
| Example 2 | Transparent conductive film B | 25.4 | 200 | 1.0 | 25.8 | 177 | 1.0 |
| Comparative Example 1 | Transparent conductive film C | 21.0 | 115 | 1.0 | 19.0 | 115 | 1.0 |

(Measurement of Coefficient of Dynamic Friction)

Two transparent conductive films A were arranged so that transparent conductive layers faced each other, and then coefficients of dynamic friction between the pattern parts, between the pattern part and the pattern-opening part and between the pattern-opening parts were each measured. Measurements of the coefficient of dynamic friction were conducted in accordance with JIS K7125 using Auto Graph (AG-1S manufactured by SHIMADZU CORPORATION).

The coefficient of dynamic friction was measured in the same manner for each of a combination of two transparent conductive films C and a combination of the transparent conductive film A and the transparent conductive film C. The measurement results are shown in Table 2. It is to be noted that for the coefficient of dynamic friction between the pattern part and the pattern-opening part in the combination of the transparent conductive films A and C in Table 2, the value in the upper section shows a coefficient of dynamic friction for the combination of the pattern-opening part of the transparent conductive film A and the pattern part of the transparent conductive film C, and the value in the lower section shows a coefficient of dynamic friction for the combination of the pattern part of the transparent conductive film A and the pattern-opening part of the transparent conductive film C.

TABLE 2

| Combination of transparent conductive films | | Pattern parts | Pattern-opening parts | Pattern part and pattern-opening part |
|---|---|---|---|---|
| A | A | 0.34 | 0.32 | 0.44 |
| C | C | 0.35 | 0.37 | 0.69 |
| A | C | 0.45 | 0.36 | 0.33 |
| | | | | 0.46 |

<Preparation of Touch Panel and Sliding Test>

Example 3

The transparent conductive film A cut into a size of 20 mm×20 mm was used for both the upper electrode and the lower electrode, and spacers each having a thickness of 180 μm were arranged at both ends thereof to prepare a touch panel schematically shown in FIG. 5 (but the touch panel did not have a spherical spacer 53) in which the forming faces of two transparent conductive films were so arranged as to face each other. In formation of the touch panel, the transparent conductive film of the upper electrode and the transparent conductive film of the lower electrode were arranged so that the transparent conductive layer forming surfaces of both the films faced each other, and their pattern directions were orthogonal to each other.

Sliding was carried out 50000 times (25000 reciprocations) under a load of 1 kg from the upper electrode substrate 51 side of the touch panel using a pen 60 formed of polyacetal (pen point R=0.8 mm). After the sliding test, the touch panel was disintegrated, and the level of occurrence of scratches at the pattern part and the pattern-opening part was visually checked under reflected light of a fluorescent lamp for each of the upper electrode substrate and the lower electrode substrate.

Example 4

A touch panel was prepared in the same manner as in Example 3 described above except that the transparent conductive film B was used for both the upper electrode and the lower electrode.

Example 5

A touch panel was prepared in the same manner as in Example 3 described above except that the transparent conductive film C was used for the upper electrode and the transparent conductive film A was used for the lower electrode.

Example 6

A touch panel was prepared in the same manner as in Example 3 described above except that the transparent conductive film obtained in Example 1 was used for the upper electrode and the transparent conductive film obtained in Comparative Example 1 was used for the lower electrode.

Comparative Example 4

A touch panel was prepared in the same manner as in Example 3 described above except that the transparent conductive film C was used for both the upper electrode and the lower electrode.

The results of evaluation for scratches after the sliding test are shown in Table 3. Evaluations were performed in the three grades described below.

1: No scratches are visually identified.

2. Small scratches are visually identified, but they are at an insignificant level from a practical standpoint.

3: Scratches that look white are visually identified.

TABLE 3

| | Combination of transparent conductive films | | Upper electrode | | | | Lower electrode | | | |
|---|---|---|---|---|---|---|---|---|---|---|
| | | | Pattern part P | | Pattern-opening part O | | Pattern part | | Pattern-opening part | |
| | | | Sliding with | Sliding with | Sliding with | Sliding with | Sliding with | Sliding with | Sliding with | Sliding with |
| | Upper electrode | Lower electrode | lower electrode P | lower electrode O | lower electrode P | lower electrode O | upper electrode P | upper electrode O | upper electrode P | upper electrode O |
| Example 3 | A | A | 1 | 1 | 2 | 2 | 1 | 1 | 2 | 1 |
| Example 4 | B | B | 1 | 1 | 2 | 2 | 1 | 1 | 2 | 1 |
| Comparative Example 1 | C | C | 1 | 1 | 3 | 3 | 1 | 1 | 3 | 1 |
| Example 5 | A | C | 1 | 1 | 2 | 2 | 1 | 1 | 3 | 1 |
| Example 6 | C | A | 1 | 1 | 3 | 1 | 1 | 1 | 2 | 1 |

According to Table 3, it is apparent that for Comparative Example 1 in which the transparent conductive film of the present invention is not used for any of the upper electrode and the lower electrode, both the upper electrode and the lower electrode have areas of grade "3" at the pattern-opening part, so that visibility is deteriorated. In contrast, for Examples 3 and 4 in which the transparent conductive film of the present invention is used for both the upper electrode substrate and the lower electrode substrate, none of the upper electrode and the lower electrode has an area of grade "3", so that satisfactory visibility is retained even after the sliding test.

For Examples 5 and 6 in which the transparent conductive film of the present invention is used for one of the upper electrode and the lower electrode, a large scratch is identified in the areas of sliding with the pattern part (ITO film) of the opposed electrode at the pattern-opening part of an electrode for which the transparent conductive film of the present invention is not used. However, the electrode for which the transparent conductive film of the present invention is used does not have an area of grade "3", so that satisfactory visibility is retained even after the sliding test.

According to Table 3, it is apparent that when the pattern part P of one electrode and the pattern-opening part O of the other electrode are caused to slide with each other, scratches tend to easily occur, but when the transparent conductive film of Example is used, the coefficient of dynamic friction between the pattern part and the pattern-opening part is small in comparison with Comparative Example as shown in Table 2, so that occurrence of scratches is suppressed.

DESCRIPTION OF REFERENCE SIGNS

1 transparent film base
1a, 1b base
2 dielectric layer
21 dielectric layer
22 dielectric layer
2a, 2b dielectric layer
3 transparent conductive layer
3a, 3b transparent conductive layer
4 pressure-sensitive adhesive layer
5 transparent substrate
11 surface coating layer
P pattern part
O pattern-opening part
51 upper electrode substrate
52 lower electrode substrate
53 spacer
100 transparent conductive film
200 touch panel

The invention claimed is:

1. A transparent conductive film comprising a transparent film base; at least one dielectric layer formed on a first main surface of the transparent film base; and a transparent conductive layer formed on the dielectric layer, wherein
    the transparent conductive layer is patterned;
    a first main surface of the transparent conductive film has an arithmetical mean roughness Ra of 22 nm or more, and exposed surface of the dielectric layer at a pattern-opening part has 140/mm$^2$ to 550/mm$^2$ of protrusions having heights of 250 nm or higher; and
    a thickness of the dielectric layer is 50 nm or less.

2. The transparent conductive film according to claim 1, wherein the surface on the first main surface of the transparent conductive film has an arithmetical mean roughness Ra of 22 nm or more and has 140/mm$^2$ or more of protrusions having heights of 250 nm or higher at a pattern part in which the transparent conductive layer is formed.

3. The transparent conductive film according to claim 1 or 2, wherein a haze value at the pattern-opening part is 2.0% or less.

4. The transparent conductive film according to claim 2, wherein a haze value at the pattern part is 2.0% or less.

5. The transparent conductive film according to claim 1, wherein the transparent film base contains particles.

6. The transparent conductive film according to claim 1, wherein at least one dielectric layer contains particles.

7. The transparent conductive film according to claim 1, wherein the dielectric layer exposed at the pattern-opening part is a dielectric layer composed of an organic material.

8. The transparent conductive film according to claim 1, wherein the transparent conductive layer is patterned in a stripe form.

9. A resistive touch panel comprising the transparent conductive film according to claim 1.

10. A touch panel comprising an upper electrode substrate; a lower electrode substrate; and a spacer arranged between the upper electrode substrate and the lower electrode substrate, wherein
    the upper electrode substrate includes the transparent conductive film according to claim 8;
    the lower electrode substrate includes a patterned transparent conductive layer having a pattern part in which the transparent conductive layer is formed and a pattern-opening part in which the transparent conductive layer is not formed, the transparent conductive layer being patterned in a stripe form; and the upper electrode substrate and the lower electrode substrate are arranged so that the transparent conductive layers of both the substrates face each other, and the pattern directions are orthogonal to each other.

11. A touch panel comprising an upper electrode substrate; a lower electrode substrate; and a spacer arranged between the upper electrode and the lower electrode, wherein the upper electrode substrate includes a patterned transparent conductive layer having a pattern part in which the transparent conductive layer is formed and a pattern-opening part in which the transparent conductive layer is not formed, the transparent conductive layer being patterned in a stripe form;

the lower electrode substrate includes the transparent conductive film according to claim 8; and the upper electrode substrate and the lower electrode substrate are arranged so that the transparent conductive layers of both the substrates face each other, and the pattern directions are orthogonal to each other.

12. A touch panel comprising an upper electrode substrate; a lower electrode substrate; and a spacer arranged between the upper electrode substrate and the lower electrode substrate, wherein each of the upper electrode substrate and the lower electrode includes the transparent conductive film according to claim 8; and the transparent conductive film of the upper electrode substrate and the transparent conductive film of the lower electrode substrate are arranged so that the transparent conductive layers of both the films face each other, and the pattern directions of the transparent conductive layers are orthogonal to each other.

13. The touch panel according to any one of claims 9 to 11, wherein a coefficient of dynamic friction between the pattern-opening part of the upper electrode substrate and the pattern-opening part of the lower electrode substrate is 0.45 or less; and a coefficient of dynamic friction between the pattern-opening part of the upper electrode substrate and the pattern part of the lower electrode substrate and a coefficient of dynamic friction between the pattern part of the upper electrode substrate and the pattern-opening part of the lower electrode substrate are both 0.45 or less.

* * * * *